United States Patent [19]

Kumabe et al.

[11] Patent Number: 4,841,532
[45] Date of Patent: Jun. 20, 1989

[54] SEMICONDUCTOR LASER

[75] Inventors: Hisao Kumabe; Wataru Susaki, both of Itami, Japan

[73] Assignee: Mitsubishi Denki Kabushiki Kaisha, Japan

[21] Appl. No.: 119,340

[22] Filed: Nov. 10, 1987

[30] Foreign Application Priority Data

Nov. 13, 1986 [JP] Japan .................................. 61-270695

[51] Int. Cl.$^4$ .............................................. H01S 3/19
[52] U.S. Cl. ...................................... 372/45; 372/46; 372/49
[58] Field of Search .................... 372/43, 45, 50, 46, 372/49; 437/38, 48, 66, 68, 226; 357/17

[56] References Cited

U.S. PATENT DOCUMENTS 4,236,296 12/1980 Woolhouse et al. ................. 437/226
4,523,316 6/1985 Botez .................................. 372/45

OTHER PUBLICATIONS

"Optimum Design Conditions for AlGaAs Window Stripe Lasers", IEEE Journal of Quantum Electronics, vol. QE-17, No. 10, pp. 2113 to 2122.

"Large Optical Cavity AlGaAs Buried Heterostructure Window Lasers", Appl. Phys. Lett. 40(12), 1982, pp. 1029 to 1031.

"Nonabsorbing-Mirror (NAM) CDH-LOC Diode Lasers", Electronics Letters, vol. 20, No. 13, 1984, pp. 530 to 531.

Primary Examiner—William L. Sikes
Assistant Examiner—B. R. R. Holloway
Attorney, Agent, or Firm—Leydig, Voit & Mayer

[57] ABSTRACT

A method for producing a semiconductor laser which comprises sequentially depositing a lower cladding layer, an active layer, and an upper cladding layer on a substrate, forming a V shaped groove in the deposited layers at least reaching the lower cladding layer, the groove extending in a direction perpendicular to the direction between the surfaces that are to become resonator end surfaces, growing a semiconductor layer having a larger energy band gap than that of the active layer in the groove while retaining the V shaped groove, and cleaving the substrate and layers along the V shaped groove.

10 Claims, 2 Drawing Sheets

SEMICONDUCTOR LASER

FIELD OF THE INVENTION

The present invention relates to a high output semiconductor laser, operable at a high temperature, which is used as a light source in a light communication system, a light information processing system or the like, and a method of producing such a semiconductor laser.

BACKGROUND ART

FIGS. 3(a) and 3(b) show cross-sections of structures of the resonator end portion and the resonator direction of a prior art semiconductor laser. In FIGS. 3(a) and 3(b), the reference numeral 21 designates a substrate comprising p type GaAs, numeral 22 designates a current blocking layer comprising n type GaAs, numeral 23 designates a lower cladding layer comprising p type $Al_yGa_{1-y}As$, numeral 24 designates an active layer comprising $Al_xGa_{1-x}As$, numeral 25 designates an upper cladding layer comprising n type $Al_yGa_{1-y}As$, numeral 26 designates a contact layer comprising n type GaAs, numeral 27 designates a stripe groove, and numerals 28 and 29 designate p and n electrodes comprising metal layers, respectively. Herein, the composition proportion x and y are chosen such that $x < y$. Reference numerals 30 and 31 designate resonator end surfaces.

After growing an n type GaAs current blocking layer 22 on a p type GaAs substrate 21, a stripe groove 27 of a depth reaching the substrate 21 is produced. Subsequently, a lower cladding layer 23 comprising p type $Al_yGa_{1-y}As$, an active layer comprising $Al_xGa_{1-x}As$, an upper cladding layer comprising n type $Al_yGa_{1-y}As$, and a contact layer 26 comprising n type GaAs are successively grown thereon, and resonator end surfaces 30 and 31 are produced by cleavages. Electrodes 28 and 29 are deposited to complete a laser shown in FIGS. 3(a) and 3(b).

When a forward voltage is applied between the p type electrode 28 and the n type electrode 29, a forward direction current larger than a threshold value flows through the active layer 24. The current is concentrated in the groove width of the active layer 24 due to the internal current confinement structure comprising the current blocking layer 22 and the groove 27. In addition to the double hetero junction (DH) in the thickness direction of the active layer 24, an effective refractive index difference is provided between groove 27 and its sides in the transverse direction. These structures effectively confine current carriers and light waves the active region. Thus, this semiconductor laser shows a high operating efficiency at a high temperature, at a low threshold current, and in a transverse fundamental mode.

This prior art semiconductor laser has no problems when it is used at a relatively low output level of about 5 mW. However, several problems arise when it is operated at a light output larger than about 20 to 30 mW.

Generally, the active layer 24 has a uniform thickness between the resonator end surface portions 30 and 31 as shown in FIG. 3(b), and it has uniform crystalline composition. In an AlGaAs series laser having such an active layer 24, the resonator end surfaces 30 and 31 become light absorption regions due to the lack of carriers because of a rapid surface recombination. When the light output is increased, the light absorption at the resonator end surfaces 30 and 31 is increased, and a cycle of light absorption, heat generation, temperature rising of the resonator end surfaces occurs. The resonator end surfaces are melted and destroyed at above a particular light density (several $MW/cm^2$ in AlGaAs series). This phenomenon is called COD (Catastrophic Optical Damage). When COD arises, characteristics of the semiconductor laser is deteriorate and the laser device fails. Several attempts have been made to prevent COD. One way of preventing COD is to selectively diffuse impurities, such as p type impurities, into the active layer in the bulk of the resonator and n type impurities into the active layer at the interface between the active layer and the resonator end surfaces. Another way of preventing COD is selectively growing of a layer having a large energy band gap, relative to that of the resonator, at the resonator end surfaces.

These methods are intended to produce a non-absorbing mirror (NAM) structure in which the energy band gap of the active layer at the resonator end surfaces is larger than that of the active layer in the bulk of the resonator and absorption at the resonator, end surfaces is reduced. When this NAM structure is thus adopted, it is possible to raise the light density at which a COD occurs more than one order of magnitude (several 10 $MW/cm^2$) over that of a usual laser, and to obtain higher power output operation.

The prior art NAM structure has several disadvantages. A complicated production process and a high precision control technique for controlling the width and depth of diffusion and the position of the cleavage are required. The threshold current is also increased and the astigmatism is greatly increased in a case where a refractive index guide is not provided at the resonator end surfaces in the transverse direction.

SUMMARY OF THE INVENTION

An object of the present invention is to provide a high output semiconductor laser stable at high temperatures and which has a low threshold current and little astigmatism.

Another object of the present invention is to provide a simple method of producing a semiconductor laser with the above-described properties and with good reproducibility.

Other objects and advantages of the present invention will become apparent from the detailed description given hereinafter. It should be understood, however, that the detailed description and specific embodiment are given by way of illustration only. Various changes and modifications within the spirit and scope of the invention will become apparent to those skilled in the art from this detailed description.

According to an aspect of the present invention, a semiconductor laser is provided by sequentially depositing a lower cladding layer, an active layer, and an upper cladding layer on a substrate. A stripe V shaped groove is formed in the deposited layers reaching at least into the lower cladding layer. The groove extends in a direction perpendicular to the resonator direction at the resonator end surface. A semiconductor layer having a larger energy band gap than that of the active layer and retaining as the V shaped groove is then grown. The wafer is then cleaved along the length of the V shaped groove.

According to another aspect of the present invention, a method is provided for producing a semiconductor laser wherein said method comprises successively depositing a lower cladding layer, an active layer, an upper cladding layer, and a contact layer on a substrate, forming a V shaped groove in the deposited layers reaching at least into the lower cladding layer, the groove lying in a direction perpendicular to the direction to extend between the resonator end surfaces growing a semiconductor layer having a larger energy band gap than that of the active layer in the groove while retaining the configuration of the V shaped groove, and cleaving the wafer along the length of the V shaped groove.

DETAILED DESCRIPTION OF THE PREFERRED EMBODIMENTS

Figure 1:
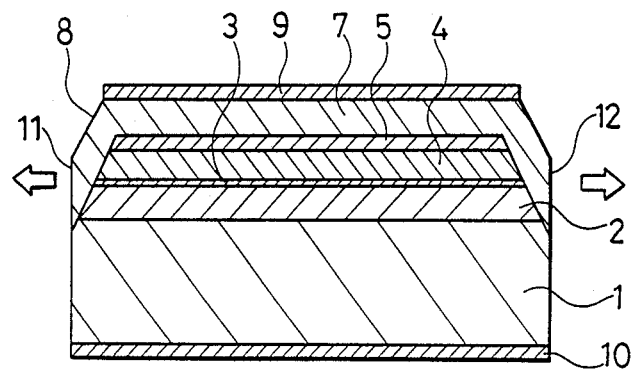
FIG. 1 is a cross-sectional view, taken along the resonator direction, showing a structure of a semiconductor laser according to an embodiment of the present invention.

FIG. 1 is a cross-sectional view showing a structure, taken along the resonator direction, of a semiconductor laser according to an embodiment of the present invention.

Figure 2:
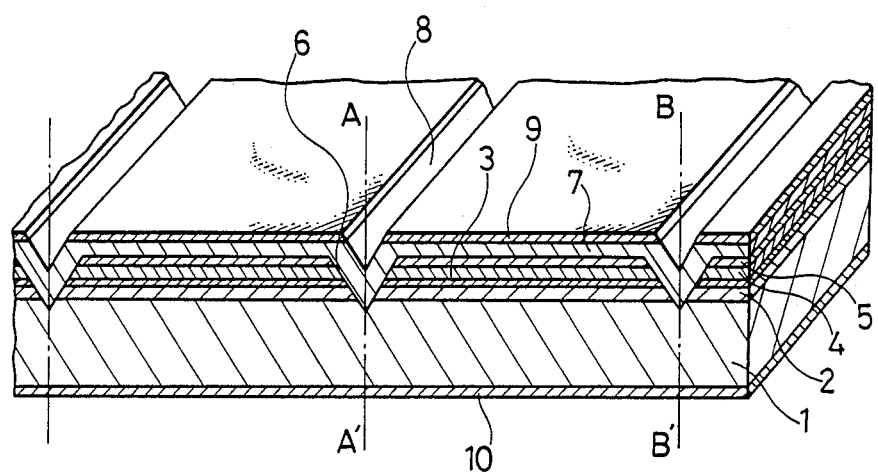
FIG. 2 is a cross-sectional and perspective view showing a wafer structure of the present invention.
Figure 3A:
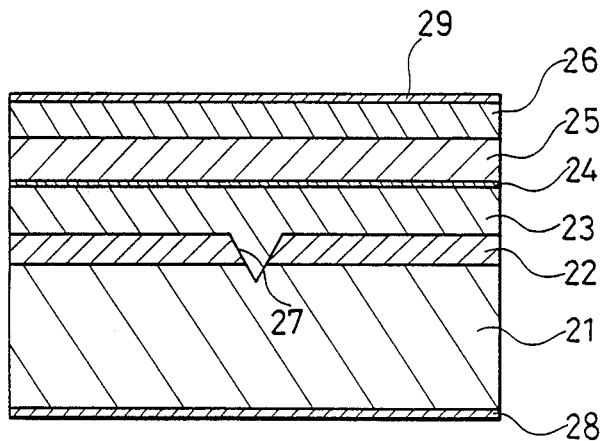
FIGS. 3(a) and 3(b) are cross-sectional diagrams showing a structure of a prior art semiconductor laser.
Figure 3B:
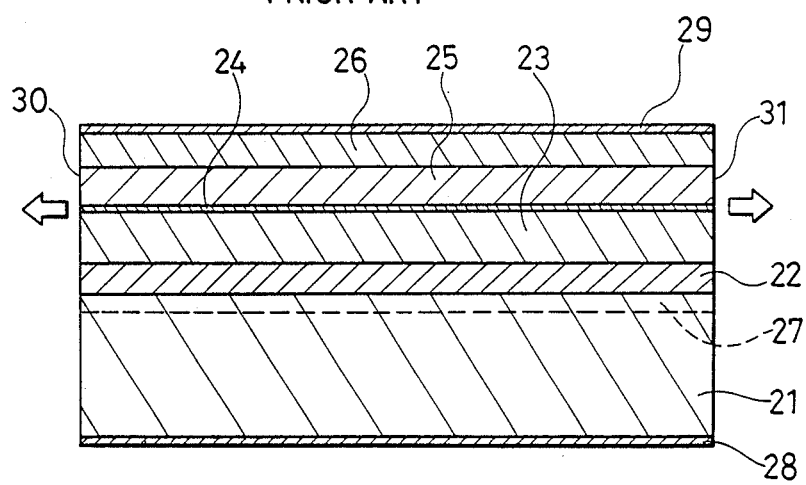

FIG. 2 shows a wafer from which one or more of the lasers of FIG. 1. In these figures, reference numeral 1 may be produced by cleaving designates a substrate comprising p type GaAs, numeral 2 designates a lower cladding layer comprising p type $Al_yGa_{1-y}As$, numeral 3 designates an active layer comprising $Al_xGa_{1-x}As$, numeral 4 designates an upper cladding layer comprising n type $Al_yGa_{1-y}As$, numeral 5 designates a contact layer comprising n type GaAs, numeral 6 designates a V shaped groove, numeral 7 designates an n type $Al_zGa_{1-z}As$ layer having a larger energy band gap than the active layer 3. Numeral 8 designates a sloped surface of the n type $Al_zGa_{1-z}As$ layer 7 at the resonator end surface, numerals 9 and 10 designate n and p electrodes, respectively, and numerals 11 and 12 designate resonator end surfaces.

Herein, the composition proportions x, y, and z are chosen such that $x < y$ and $x < z$.

At first, the lower cladding layer 2, the active layer 3, the upper cladding layer 4, and the contact layer 5 are sequentially grown on the substrate 1 by a conventional crystal growth method such as liquid phase epitaxy (LPE) or metal-organic chemical vapor deposition (MO-CVD). Thereafter, a V shaped groove 6 is formed in a direction perpendicular to the direction which extends between what become the resonator end surfaces. Groove 6 is produced by photolithography and etching. The V shaped groove 6 has a width of 5 to 10 μm, and a depth that at least exposes the active layer 3, for example, 5 to 8 μm.

Next, by a conventional growth technique such as MO-CVD, an n type $Al_zGa_{1-z}As$ layer 7 is grown in V shaped groove 6 to such a thickness that it embeds at least the exposed active layer 3. It is possible to retain the configuration of the V shaped groove 6, as indicated by the sloped surface 8 in FIG. 2, by growing the n type $Al_zGa_{1-z}As$ layer 7 by the MO-CVD method. Thereafter, the device is cleaved along lines A–A' and B–B' in FIG. 2 to obtain a semiconductor laser as shown in FIG. 1 with an n type $Al_zGa_{1-z}As$ layer 7 having a larger band gap than at the resonator end surfaces 11 and 12 than that of the active layer 3.

The semiconductor laser shown in FIG. 1 has an NAM structure in which the resonator end surfaces 11 and 12 comprise an n type $Al_zGa_{1-z}As$ layer 7 having a larger energy band gap than the active layer 3. Thus light absorption at the resonator end surfaces 11 and 12 does not occur, and the light density at which the COD occurs is raised by more than one order of magnitude relative to a usual laser. Thus, it is possible to operate the laser of FIG. 1 at a high light output stably by increasing the current.

In the above-illustrated embodiment, the simplest semiconductor laser having the DH structure and an entire surface electrode is described. However, the present invention can be applied to lasers of any structure such as an electrode stripe type laser, lasers in which a built-in refractive index guide is provided in the transverse direction such as a Channeled Substrate Planar laser, a Buried Heterostructure laser, a Buried Crescent laser, and a Transverse Junction Stripe laser, and lasers of advanced versions of one of above-described structures. In these lasers, characteristics such as the oscillation threshold values and oscillation modes of the original structure are reproduced without deterioration, and a higher output and stable operation of these lasers are possible due to the NAM structure.

Furthermore, in the embodiment of FIG. 1, the distance from the sloped surface of the active layer to the cleaved resonator end surface is short, for example, 1 or 2 μm. Accordingly, there is almost no increment of the oscillation threshold value and astigmatism.

In the above-illustrated embodiment as AlGaAs/GaAs series semiconductor laser is described. However, the present invention can be applied to semiconductor lasers of InGaAsP/InP series or AlInGaP/GaAs series lasers with the same effects as described above.

According to the present invention, a V shaped groove of a depth exposing at least the active layer is produced in a direction perpendicular to the direction that extends between what are to become the resonator end surfaces of a semiconductor laser on a wafer including at least an active layer and upper and lower cladding layers. Thereafter a semiconductor layer having a larger energy band gap than the active layer is grown in the groove on the wafer so as to retain the configuration of the V shaped groove structure. The wafer is then cleaved along the length of two V shaped grooves, whereby an NAM structure is easily produced and a high output and high performance laser is easily obtained with good reproducibility.

What is claimed is:

1. A semiconductor laser comprising sequentially disposed, on a first surface of a substrate, a first semiconductor cladding layer of a first conductivity type, an active semiconductor layer having a first band gap energy, a second semiconductor cladding layer of a second conductivity type opposite from said first conductivity type, and a semiconductor contacting layer of said second conductivity type, said first surface extending in generally perpendicular first and second directions, said second cladding layer, said active layer, and at least part of said first cladding layer having generally planar first and second ends, said ends lying in planes that are oblique to said first direction and generally parallel to said second direction, and a fifth semiconductor layer disposed at least on said ends, said fifth semiconductor layer being of said second conductivity type and having a second energy band gap larger than said first energy band gap, whereby a non-absorbing mirror structure is provided at each of said ends.

2. The semiconductor laser of claim 1 wherein said fifth semiconductor layer overlies said contacting layer.

3. The semiconductor laser of claim 2 including a first electrode disposed on said fifth semiconductor layer opposite said contacting layer and a second electrode disposed on said substrate opposite said first cladding layer.

4. The semiconductor laser of claim 1 wherein said first cladding layer is $Al_yGa_{1-y}As$, said active layer is $Al_xGa_{1-x}As$, said second cladding layer is $Al_yGa_{1-y}As$, and said fifth semiconductor layer is $Al_zGa_{1-z}As$, wherein both y and z are greater than x.

5. The semiconductor laser of claim 4 wherein said first conductivity type is p type.

6. The semiconductor laser of claim 4 wherein said substrate is GaAs.

7. The semiconductor laser of claim 4 wherein said contacting layer is GaAs.

8. The semiconductor laser of claim 1 wherein said first and second ends are formed by chemical etching, and said fifth layer is deposited by epitaxial growth on said first and second ends and on said contacting layer.

9. The semiconductor laser of claim 1 wherein said fifth layer forms opposed, generally planar, first and second resonator end surfaces generally opposed to and intersecting said first and second ends, respectively, for transmitting light produced by said laser.

10. The semiconductor laser of claim 9 wherein said resonator end surfaces are formed by cleaving.

* * * * *